United States Patent [19]

Bobeck et al.

[11] 3,996,574
[45] Dec. 7, 1976

[54] MAGNETIC BUBBLE, FIELD-ACCESS ASSEMBLY

[75] Inventors: Andrew Henry Bobeck, Chatham; Bruce Hamilton McGahey, South Plainfield, both of N.J.; William Martin Melbert, Jr., Indianapolis, Ind.; Terry Brice Prince, Indianapolis, Ind.; Martin James Stevenson, Indianapolis, Ind.

[73] Assignees: Western Electric Company, Inc., New York, N.Y.; Bell Telephone Laboratories, Incorporated, Murray Hill, N.J.

[22] Filed: Feb. 24, 1975

[21] Appl. No.: 552,267

Related U.S. Application Data

[63] Continuation-in-part of Ser. No. 470,410, May 16, 1974, abandoned.

[52] U.S. Cl. .................. 340/174 TF; 340/174 S
[51] Int. Cl.² ................................ G11C 11/14
[58] Field of Search ............ 340/174 TF, 174 MA; 336/188, 200, 225

[56] References Cited

UNITED STATES PATENTS

| 3,806,899 | 4/1974 | Myer ........................... 340/174 TF |
| 3,848,209 | 11/1974 | Lee et al. ..................... 340/174 TF |
| 3,879,585 | 4/1975 | Bobeck et al. ............... 340/174 TF |

OTHER PUBLICATIONS

IEEE Transactions on Magnetics, vol. Mag-9, No. 3 Sept. 1973 pp. 429–433.
IEEE Trans. On Mag. "Magnetic Bubble Mass Memory–Module Design and Operation" by Michaelis et al., vol. Mag. 9, No. 3, 9/73 pp. 436–440.

Primary Examiner—James W. Moffitt
Attorney, Agent, or Firm—Herbert M. Shapiro

[57] ABSTRACT

A dual-in-line package (DIP) for a bubble memory is achieved by mounting the bubble chip in a cantilevered position in the plane of a rigid conductor arrangement which is interconnected to a DIP base. The lead track arrangement forms a rigid support for the chip fixing the chip in a position for receiving the orthogonal coils which characteristically supply the rotating field for field-access bubble operation.

16 Claims, 9 Drawing Figures

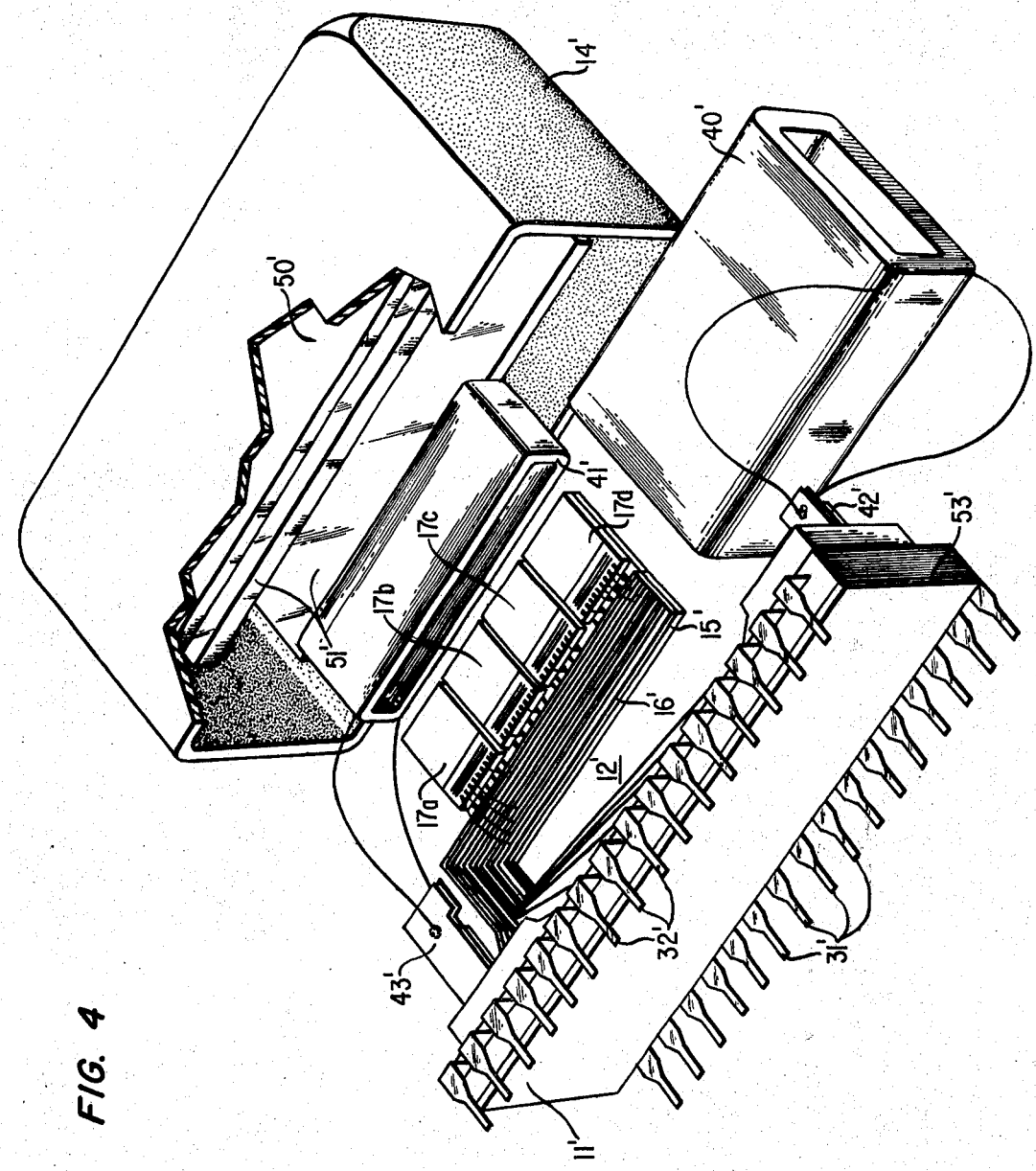

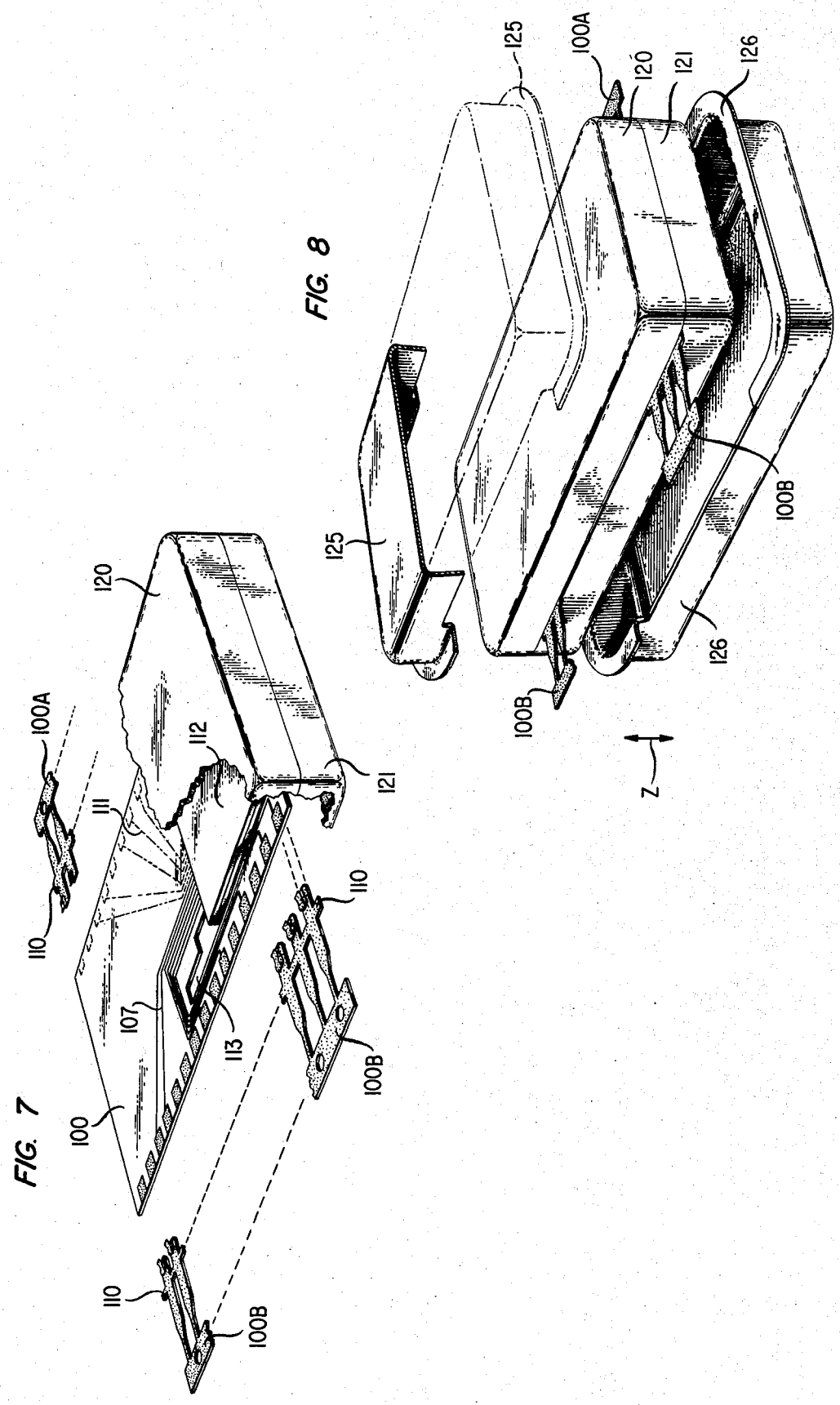

MAGNETIC BUBBLE, FIELD-ACCESS ASSEMBLY

CROSS REFERENCE TO RELATED APPLICATION

The present patent application is a continuation-in-part of U.S. patent application Ser. No. 470,410 filed May 16, 1974 now abandoned, for the inventors in the present application.

FIELD OF THE INVENTION

This invention relates to a magnetic memory assemblage and more particularly to a magnetic bubble, field-access packaging arrangement.

BACKGROUND OF THE INVENTION

Magnetic bubble, "field-access" memories are now well known in the art. A characteristic of such a bubble memory is the pair of coils which provides a magnetic field which reorients (typically rotates) in the plane of the material (chip) in which the magnetic bubbles move. The bubble memory chip is encompassed by the field generating coils. Therefore, provision must be made to interconnect electrical conductors defined on the surface of the chip to drivers external to the coils. Since these coils are disposed orthogonally with respect to one another, one fits within the other in the most practical arrangements to date. Since the power required to drive the coils increases as does the size of the coils, the coils are kept as small as possible, and they fit together rather closely. Therefore, space allocated for the passage of electrical conductors through the coils is increased at the expense of increased power requirements and it is advantageous to maintain that space small.

Moreover, heat dissipated in the volume encompassed by the coils is advantageously removed by provision of a heat conduction path through the coils. This too is provided at the expense of an increase in the size of the coils and thus an increase in power.

BRIEF DESCRIPTION OF THE INVENTION

A magnetic chip, in which a bubble memory is defined in one embodiment herein, is mounted in a plane which is orthogonal to that of a dual-in-line connector base through which external contact to the magnetic chip is provided. The lead track arrangement supports the chip in a cantilevered position in that plane for receiving the orthogonal coil arrangement and provides for easy access for drive conductors and for heat dissipation.

The chip in one embodiment is elongated having one end thereof mounted directly onto one of a pair of laminated lead tracks. The lead tracks are laminated in an offset manner so that the first track abuts one edge of the chip. The second supports the chip and protrudes beyond the other edge of the chip. A lead track defined on the surface of the chip terminates at both edges thereof allowing for a reduced area of interconnection to the laminated lead tracks.

In a second embodiment, a plurality of chips are similarly supported by an extension of one of two lead tracks in a spaced-apart position to permit the provision of lead connections to the two lead tracks from one edge of the chips.

In each of third and fourth embodiments, conductor arrays are defined on a dimensionally stable insulating board, the resulting structure being apertured, in each instance, to define a cantilevered position for supporting a chip (or a plurality of chips) in the plane of the board.

The arrangements require relatively small space allowances for electrical conductors through the coils and provides, in at least one instance, increased heat conduction by intimate connection between the chip and the conductors of the one of the laminated lead tracks to which the chip is mounted.

BRIEF DESCRIPTION OF THE DRAWING

FIG. 4 is an exploded projection view, also partially cut away, of an alternative bubble memory assembly in accordance with this invention.

FIGS. 5, 6, 7, 8, show top, projection and partially cut away exploded views of another embodiment of this invention in successive stages of assembly.

DETAILED DESCRIPTION

Figure 1:
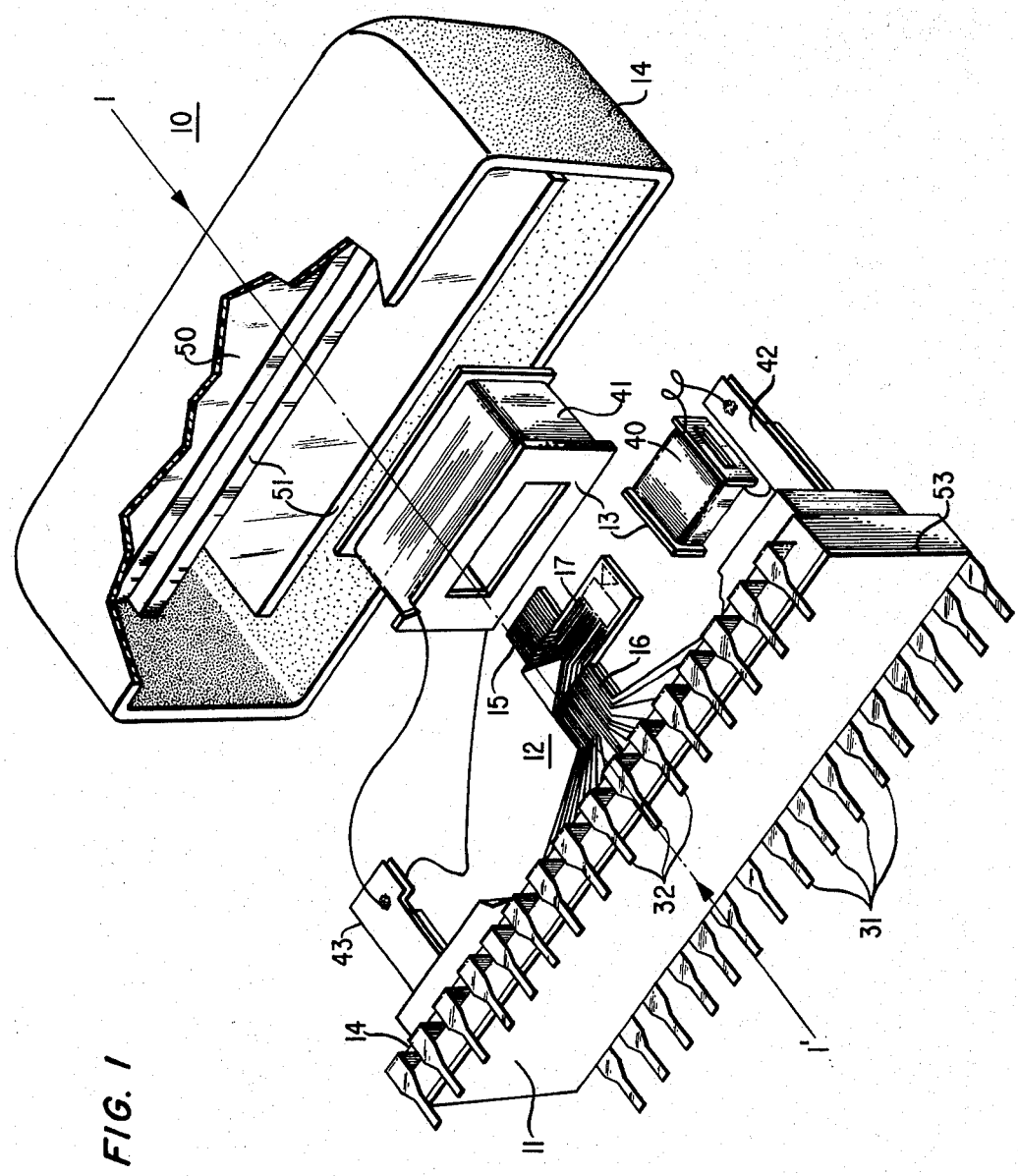
FIG. 1 is an exploded projection view, partially cut away, of a bubble memory assembly in accordance with this invention.

FIG. 1 shows an exploded view of a magnetic bubble repertory dialer arrangement 10 in accordance with one embodiment of this invention. The arrangement includes a base portion 11, a chip support portion 12, a coil assembly 13, and a cap portion 14.

The arrangement is designed to contain a bubble chip intended for field-access operation. To this end, the chip support portion 12 includes first and second planar lead track arrays 15 and 16 bonded together in an offset manner to define a seat for a chip 17.

Figure 2:
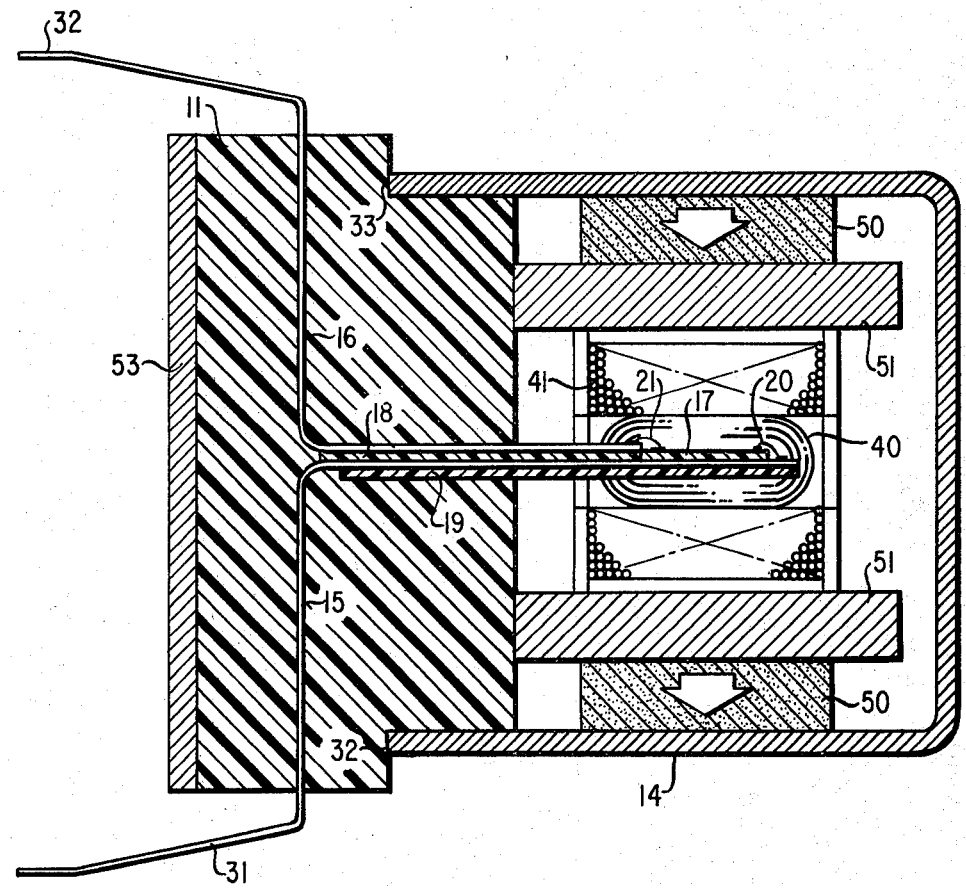
FIG. 2 is a cross-sectional view of the assembly of FIG. 1 showing the lead track arrangement and electrical continuity to the outside world.

FIG. 2 shows a cross-sectional view of the arrangement of FIG. 1 taken along line 1—1'. The figure shows an insulating spacing layer 18 and a support layer 19 on which the lead tracks are bonded. The bubble chip is bonded to the conductors of lead track 15 in a manner to leave the tips of the leads of the lead track exposed for bonding to the right side of the chip as viewed in FIG. 2. The leads of lead track 16 are available for bonding to the left side of the chip also as viewed in FIG. 2. Lead wires 20 and 21 are representative of the interconnections between chip 17 and the leads of lead track 15 and 16, respectively.

Figure 3:
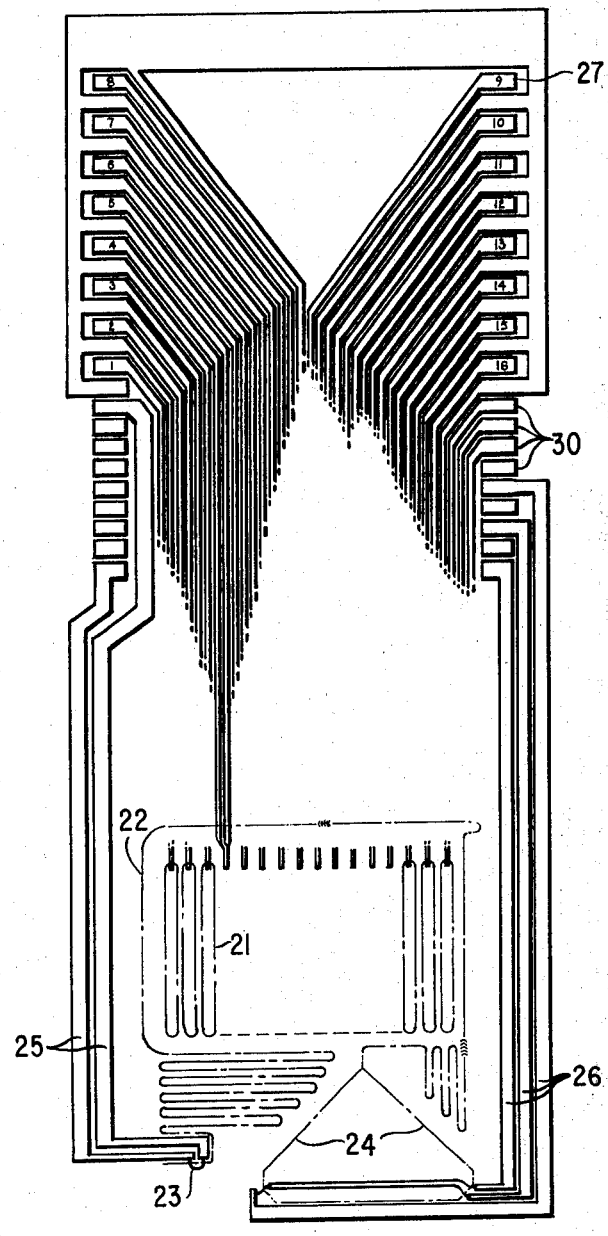
FIG. 3 is a schematic representation of a bubble chip indicating paths of bubble movement and showing conductors for interconection with the assemblage of FIG. 1.

FIG. 3 shows the permalloy and conductor patterns which define a bubble memory on chip 17. The bubble memory is defined in the usual major-minor organization. Such an organization includes a plurality of recirculating loops 21 and a major channel 22. Channel 22 extends between an input portion 23 and an expansion detector represented by the triangle-shaped area 24 to the bottom of the chip as viewed in FIG. 3.

Channel 22 follows a path which passes ports to the recirculating or storage loops. The ports are controlled, in a well-known manner, by conductors which extend upwards in the figure and terminate at the left and right edges of the chip for loops 1–8 and loops 9–16, respectively, as designated, for a representative 16 number storage capacity. Conductors 25 and conductor 26, the input and detector conductors, respectively, similarly terminate at the left and right edges, respectively. "End of dial pulse generator" conductors, designated 30 in the figure, are shown for completeness. A bubble repertory dialer of similar design is disclosed in copending application Ser. No. 443,960 filed Feb. 20, 1974 now U.S. Pat. No. 3,879,585 and assigned to the assignee of the present application. This application is now U.S. Pat. No. 3,879,585, issued Apr. 22, 1975. Since only the interconnection to conductors in such a dialer is important to the present invention, the operation of such a dialer is not discussed further herein.

It can be seen in the exploded view of FIG. 1 and in FIG. 2 that chip 17 abuts lead track 16 and is seated on the leads of lead track 15 for interconnection as represented by lead wires 21 and 20 of FIG. 2, respectively. Chip 17 thus can be seen to lie in a plane orthogonal to that of base portion 11. This is particularly clear from FIG. 2 which shows tracks 15 and 16 bent at right angles just to the left of the end of spacing (insulating) layer 18 as shown in the FIG. 2. A second bend in each track defines external leads 31 and 32.

The cantilevered position of chip 17 allows drive coils 40 and 41 to be slipped into position for providing a rotating drive field in the plane of the chip for effecting bubble movement in the familiar field-access mode. Coil 40 is the smaller of the two coils slipping over the chip and seating against the right edges of lead tracks 15 and 16 as viewed in FIG. 1. Coil 41 slips over coil 40 and seats against the base portion as shown in FIG. 2. Electrically conducting posts 42 and 43 are shown in FIG. 1 for interconnection to coils 40 and 41, respectively, as shown, for the provision of power to the coils from an external source (not shown) via associated ones of leads 31 and 32. The coils, of course, are made as small as possible and do not, in practice, have the end sections shown enlarged in the figures. The enlarged end sections are shown only for illustrative purposes.

Cap portion 14 houses a permanent magnet arrangement 50 for providing the familiar bubble bias field as well as ferrite plates 51 which make that bias field uniform. A high permeability shield element 53 (see FIG. 2) completes the assembly. The cap also is of high permeability material and provides, along with element 53, a protective shield against possibly harmful external magnetic fields. The lead tracks are conveniently potted in plastic as indicated by base portion 11 in FIG. 2 forming a shoulder against which cap portion 14 is seated when the package is assembled.

FIG. 4 shows a multiple-chip memory module similar to that shown in FIG. 1. A chip support portion 12', in such a module, includes a pair of lead tracks 15' and 16' in the multiple-chip module just as in the repertory module of FIG. 1. The lower lead track 15' is formed on an element which extends laterally to provide a support for the chips as shown. The chips, identified as 17a, 17b, 17c, and 17d, are mounted on this extension and are spaced apart from lead track 16 to allow space for bonding to the leads of lead track 15 therebeneath. Stitch bonds interconnect lands on each of the chips to associated leads on the lead tracks. In a typical configuration, each chip includes 16,000 or 64,000 bits defined by permalloy patterns with special functions (i.e., generate, replicate, and detection) being controlled via the lead tracks.

In the embodiment of FIG. 4, also, the in-plane drive field is provided by a pair of coils 40' and 41'. But here, coil 41' fits within coil 40'. Coil 41' slips over the four chips and seats against the top edge of the lead track as shown in the figure. Coil 40' slides over coil 41' to seat against the lead tracks also as shown. Electrical interconnection to the coils is effected via posts 42' and 43'. The enlarged end sections of the coils are not shown in this figure, the form shown for the coils in this figure being more like the coil geometry actually used in practice.

The chip support portion, in the embodiment of either FIG. 1 or FIG. 4, is formed of laminated lead frames each of which is photo-etched from a copper based alloy and is nonmagnetic. Typically, each lead frame is about 3 mils thick and is geometrically stable. The two frames are laminated with a 4-mil insulating spacer and are mounted on a 4-mil insulating base support. The bubble chip itself is about 7 mils thick including the nonmagnetic garnet crystal substrate, the permalloy pattern, the aluminum conductors and the aluminum oxide passivating overlay. Therefore, the chip, when bonded to one of the lead tracks, has its top surface in the plane of the second lead track.

The formation of the lead tracks as a laminated pair for receiving bubble chips allows the formation of the chip support portions herein in a continuous chain fashion conventional in solid state component assembly. During manufacture, successive support portions, for example, may extend from a continuous rail or line for successive attachment of the chips before separation of successive support portions is effected.

In one specific embodiment, a bubble repertory dialer DIP as shown in FIG. 1 had a length of about one and one-half inches. The pack included an inner coil with inside dimensions of 0.130 × 0.180 × 0.015 inch and outer dimensions of 0.175 × 0.180 × 0.068 inch. The coil had eight layers of 2.6-mil wire, a DC resistance of 22.5 ohms, a $Q \cong 2$ (3 with the ferrite cap) and an inductance of $152\mu$ henrys. The outer coil had inside dimensions of 0.330 × 0.190 × 0.070 inch and outside dimensions of 0.410 × 0.190 × 0.170. This coil too had eight layers of 5.2-mil wire, a DC resistance of 10.8 ohms and an inductance $= 276\mu$ henrys. The current for the inner and outer coils was 25mA and 65mA, respectively. The power for the inner and outer coils was 10mW and 20mW for a 100 kilohertz rotating field for the memory. The bubble chip size was 280 mils by 125 mils; the bias field was 92 oersteds, and the rotating field was 30 oersteds (minimum). Output pulses of 263 milliwatts were obtained with 2 milliamperes current. An annealed iron cap portion was used and with the permalloy layer (53 in the FIG. 1) provided 23 dB shielding.

The invention has been described in terms of dimensionally stable lead frames which are bonded together in a manner to sandwich an insulating layer therebetween. The resulting sandwich structure, of course, is conveniently also fabricated by processing conductor clad plastic, fiberglas, ceramic or other insulating material. In this instance, dimensional stability may be provided by the rigidity of the insulating material and the conductors may be defined as thin film conductor paths.

Figure 5:
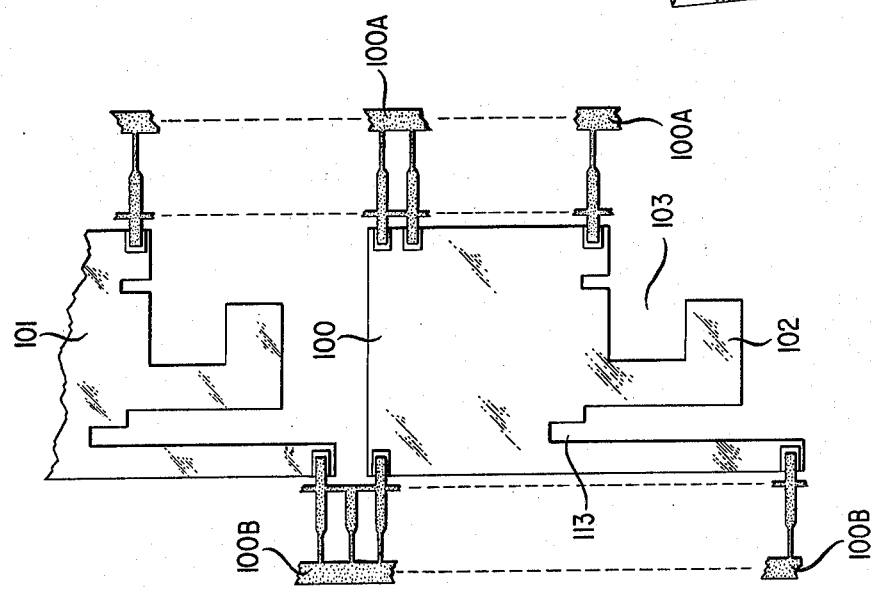

In practice, dimensionally stable insulating films bearing a cnductor pattern on each face thereof are particularly well adapted to continuous line type fabrication. FIG. 5, for example, shows successive insulating members 100 and 101 to which familiar continuous lead frames 100A and 100B are attached. Each insulating member is apertured, at its lower end, to define a portion 102 cantilevered in the plane of the member and defining a space 103 shown identified only with respect to member 100.

Figure 6:
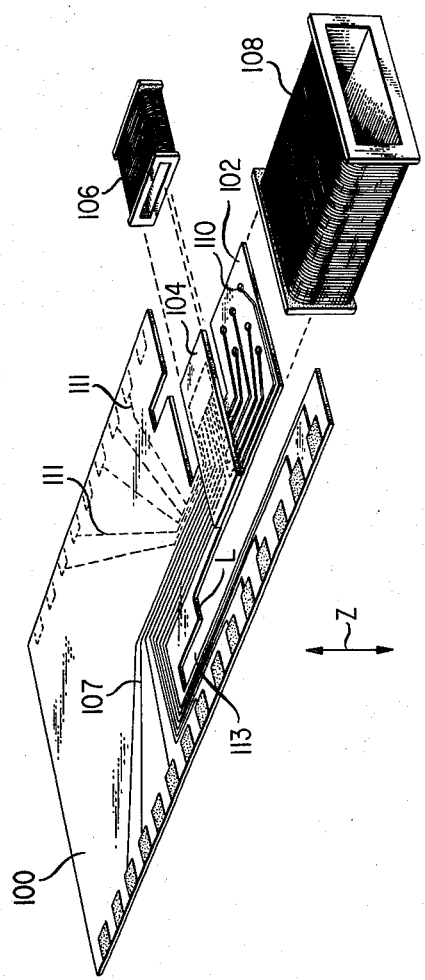

FIG. 6 shows a bubble memory chip 104 of the type shown in FIG. 3 attached to portion 102 and cantilevered into space 103. The figure also shows inner coil 106 along with a representative conductor array including conductors 107 for connection to chip 104. Coil 106 seats against portion 102 encompassing the cantilevered portion of chip 104 as does coil 40 of FIG. 1.

FIG. 6 also shows outer coil 108. Coil 108 can be seen poised to slide over portion 102, chip 104, and inner coil 106 in a manner similar to that shown for coil 41 in FIG. 1. Coil 108 seats against lip L.

Chip 104 has a bubble propagation pattern and conductor geometry similar to that shown for chip 17 in FIGS. 1 and 3 for a representative repertory dialer usage. As can be seen most clearly in FIG. 3, the conductor pattern terminates at both edges of the chip. Lead connections are made to the ends of conductors 107 conveniently by stitch bonding from the conductors terminating at the top (and left) edge of chip 104 as viewed in FIG. 6; corresponding to the right edge of the chip (17) as viewed in FIG. 3. Lead connections are similarly made to conductors illustratively connected to through connections 110 in portion 102. A conductor pattern illustratively on the underside of the insulating plane, as indicated by broken lines 111, provides electrical continuity to the leads of frame 100A. Lead frames 100A and 100B clip to lands at the termination of conductors 107 and 111, respectively.

A Watson magnet 112 (see 50 of FIG. 2) is placed over the outer coil 108 sliding into slot 113 shown in FIG. 7. Two plastic members 120 and 121 are molded to member 100 seating against conductor bars 110 of the lead frame shown in FIGS. 7 and 8. These plastic members are designed to allow egress of typically 0.7 × 10 mil conductors from the package.

The mechanical package is completed by attaching two shield halves, 125 and 126, as shown in FIG. 8. The resulting package is separated from the other packages of the line and the leads are bent and trimmed.

Figure 9:
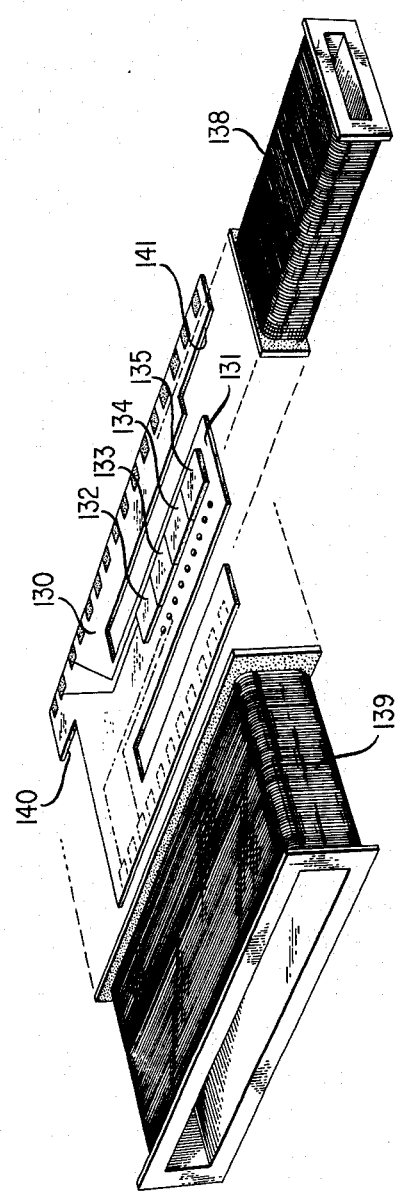
FIG. 9 shows an exploded projection view of a portion of a multichip assembly similar to the assembly of FIGS. 5–8.

FIG. 9 shows a portion of a four-chip module fabricated in a continuous line arrangement in the manner described in connection with FIGS. 5 through 8. The figure shows a generally rectangular insulating member 130, apertured to define a cantilevered portion 131 which bears four chips 132, 133, 134, 135 each nominally 200 × 200 mils. Each chip may include nominally 16,000, 64,000 or 256,000 bits depending on whether the period of the field-access propagate pattern on a chip is 28 microns, 16 microns, or 8 microns. Conductor connections to lands for external interconnection may be made via conductor patterns on member 130 on one surface or both surfaces thereof as indicated in the figure.

Inner coil 138 slides over the four-chip arrangement and portion 131. Outer coil 139 slides over member 130 seating against lips 140 and 141. In experimental use, the resulting structure may be sandwiched between two flat coils (not shown) which are operated as a bias adjust and bubble annihilation coils to provide a magnetic field along the Z axis indicated by double headed arrow Z in FIG. 8.

The four-chip package is completed in the same manner as discussed in connection with the embodiment of FIGS. 5–8.

The coils in FIGS. 5–9 are shown with enlarged end portions also for illustrative purposes only.

A comparison between the embodiments of FIG. 1 and 4 on the one hand and of FIGS. 8 and 9 on the other indicate that the dimensionally stable conductor support may owe its structural stability to the rigidity of the conductor arrays or to the rigidity of the insulating member. Moreover, that dimensionally stable support is adapted to cantilever a chip, or chips in the vertical or in the horizontal planes with respect to a dip base as indicated in the figures.

What has been described is considered merely illustrative of the principles of this invention. Therefor various embodiments can be devised by those skilled in the art in accordance with those principles within the spirit and scope of this invention as encompassed by the following claims.

What is claimed is:

1. A magnetic assembly comprising an insulating member including a plurality of electrical conductors imbedded therein, said plurality of conductors being organized in first and second planar arrays, extending through first and second and first and third surfaces of said member respectively, said arrays being joined together to form a support in a first plane orthogonal to the plane of said first surface, said support being adapted to hold a magnetic bubble chip in a cantilevered position in said first plane, and a magnetic chip affixed in said cantilevered position and electrically interconnected to conductors of said first and second arrays.

2. A magnetic assembly in accordance with claim 1 wherein said first and second planar arrays lie along an axis extending from said first surface, said first array extending along said axis further than said second array for providing a bonding surface.

3. A magnetic assembly in accordance with claim 2 wherein said magnetic chip has a first and second end portion and bears an electrical conductor pattern having first and second terminations at first and second sides of said chip at said first end portion.

4. A magnetic assembly in accordance with claim 3 wherein said chip is bonded to said bonding surface at said first end portion in a manner to expose said first and second terminations for interconnection to ones of said electrical conductors of said first and second arrays there.

5. A magnetic assembly in accordance with claim 4 also including first and second field coils, said first coil being of a geometry to slide over said second end portion of said chip, said second coil being of a geometry to slide over said first coil and said first and second lead tracks, said first and second coils when driven being cooperative to provide a magnetic field rotating in said chip in said first plane.

6. A magnetic assembly in accordance with claim 5 also including a cap portion, said cap portion housing a permanent magnet and ferrite plates to provide a uniform magnetic field normal to the plane of said chip and being adapted to mate with said insulating member.

7. A magnetic assembly in accordance with claim 1 wherein said first array is supported on a base extending beyond said second array in said first plane for providing a bonding surface.

8. A magnetic assembly in accordance with claim 7 also including a plurality of magnetic chips bonded to said bonding surface and being electrically interconnected to conductors of said first and second arrays there.

9. A magnetic assembly in accordance with claim 8 also including first and second field coils, said first coil being of a geometry to slide over said chips, said second coil being of a geometry to slide over said first coil and said first and second lead tracks, said first and second coils when driven being cooperative to provide a magnetic field rotating in said chips in said first plane.

10. A combination comprising first and second dimensionally stable lead frames each including a plurality of electrical conductors aligned along an axis, said conductors of each frame being closely spaced and widely spaced at first and second ends, respectively, said lead frames being bonded together in a manner to sandwich an insulating spacing layer therebetween and to expose said electrical conductors of each from the same side of the resulting sandwich wherein said first and second lead frames are bonded together in an offset relationship in which said first lead frame extends beyond said second lead frame along said axis at said first end.

11. Magnetic bubble assembly comprising first and second juxtaposed lead tracks offset with respect to one another along an axis in a first plane forming a bonding area for a bubble chip, a base member including first and second sets of electrical conductors in a second plane orthogonal to said first plane and being interconnected with said first and second lead track, respectively, and an elongated bubble chip having first and second end areas, said first area being in heat conducting relationship with said first lead track, said second area including a field-access bubble memory and being cantilevered in said first plane outwardly from said lead tracks.

12. A magnetic assembly comprising an insulating member including a plurality of electrical conductors imbedded therein and extending through first and second surfaces thereof, said plurality of conductors being organized in first and second planar arrays and being joined together to form a rigid support in a first plane orthogonal to the plane of said first surface, said support being adapted to hold a magnetic bubble chip in a cantilevered position in said first plane.

13. A magnetic assembly comprising an electrically insulating member having first and second surfaces, a first electrical conductor array defined at said first surface and forming a dimensionally stable planar support with said insulating member, said support being apertured to provide a cantilevered portion in the plane of said member, said conductor array extending into said cantilevered portion in a manner for interconnection with a magnetic bubble chip cantilevered from said portion.

14. A magnetic assembly in accordance with claim 13 including a second electrical conductor array.

15. A magnetic assembly in accordance with claim 14 including a magnetic bubble chip attached to said support in a cantilevered manner.

16. A magnetic assembly in accordance with claim 14 wherein said second electrical array is defined on said second surface.

* * * * *